US007831762B2

(12) United States Patent
Zheng

(10) Patent No.: US 7,831,762 B2
(45) Date of Patent: Nov. 9, 2010

(54) REDUCING THE FORMAT TIME FOR BIT ALTERABLE MEMORIES

(75) Inventor: Cheng Zheng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 11/605,572

(22) Filed: Nov. 29, 2006

(65) Prior Publication Data

US 2008/0123441 A1 May 29, 2008

(51) Int. Cl.
*G06F 12/00* (2006.01)
*G11C 16/04* (2006.01)
*G11C 13/04* (2006.01)

(52) U.S. Cl. ................. 711/103; 711/145; 711/154; 711/166; 711/171; 711/172; 365/185.29; 365/185.33; 365/218

(58) Field of Classification Search ................. 711/156, 711/144, 166, 103, 171, 172, 145, 154; 365/185.29, 365/185.33, 218
See application file for complete search history.

(56) References Cited

U.S. PATENT DOCUMENTS

| | | | | |
|---|---|---|---|---|
| 3,893,084 A | * | 7/1975 | Kotok et al. ................. 711/166 |
| 4,471,429 A | * | 9/1984 | Porter et al. ................. 711/144 |
| 5,978,245 A | * | 11/1999 | Hata et al. ................. 365/49.1 |
| 6,865,122 B2 | * | 3/2005 | Srinivasan ................. 365/200 |
| 7,390,691 B2 | * | 6/2008 | Dennison et al. ............. 438/95 |
| 7,558,904 B2 | * | 7/2009 | Nakajima ................. 711/103 |
| 2004/0013007 A1 | * | 1/2004 | Eilert ................. 365/200 |
| 2005/0190615 A1 | * | 9/2005 | Linde et al. ................. 365/200 |
| 2006/0047885 A1 | * | 3/2006 | Pan et al. ................. 711/5 |
| 2007/0029537 A1 | * | 2/2007 | Campbell ................. 257/4 |
| 2007/0136510 A1 | * | 6/2007 | Ippongi ................. 711/103 |
| 2007/0143531 A1 | * | 6/2007 | Atri ................. 711/103 |
| 2008/0112217 A1 | * | 5/2008 | Karpov et al. ................. 365/163 |
| 2008/0285332 A1 | * | 11/2008 | Zheng et al. ................. 365/163 |

OTHER PUBLICATIONS

Sean Eilert et al., Phase Change Memory, 2009,IEEE pp. 1-2.*

* cited by examiner

*Primary Examiner*—Kevin L Ellis
*Assistant Examiner*—Mehdi Namazi
(74) *Attorney, Agent, or Firm*—Trop, Pruner & Hu, P.C.

(57) ABSTRACT

In bit alterable memories, a particular header of a particular block may be programmed to a particular code to indicate that the block is to be considered empty. This saves the time of resetting all the bits in both the header and the data section of the block.

16 Claims, 4 Drawing Sheets

REDUCING THE FORMAT TIME FOR BIT ALTERABLE MEMORIES

BACKGROUND

This relates generally to bit alterable memories.

A bit alterable memory is a random access memory which is programmable one bit at a time. For example, some memories are programmable a block at a time, while the other memories may be programmed one bit at a time.

Examples of bit alterable memories include ovonic memories which use a chalcogenide phase change material, polymer memories, and battery backed random access memory.

In a conventional file system used for a random access memory, the data stored in the memory may be divided into blocks. The blocks themselves are then split into a header section and a data section. The header section is used by the file system to indicate system information for the corresponding file fragments in the data section. The boundary of the header section is a reserved, empty header.

In the course of formatting or initializing a block for subsequent use or reuse, the file system erases the entire block. This block erasing takes a lot of time.

DETAILED DESCRIPTION

Figure 1:
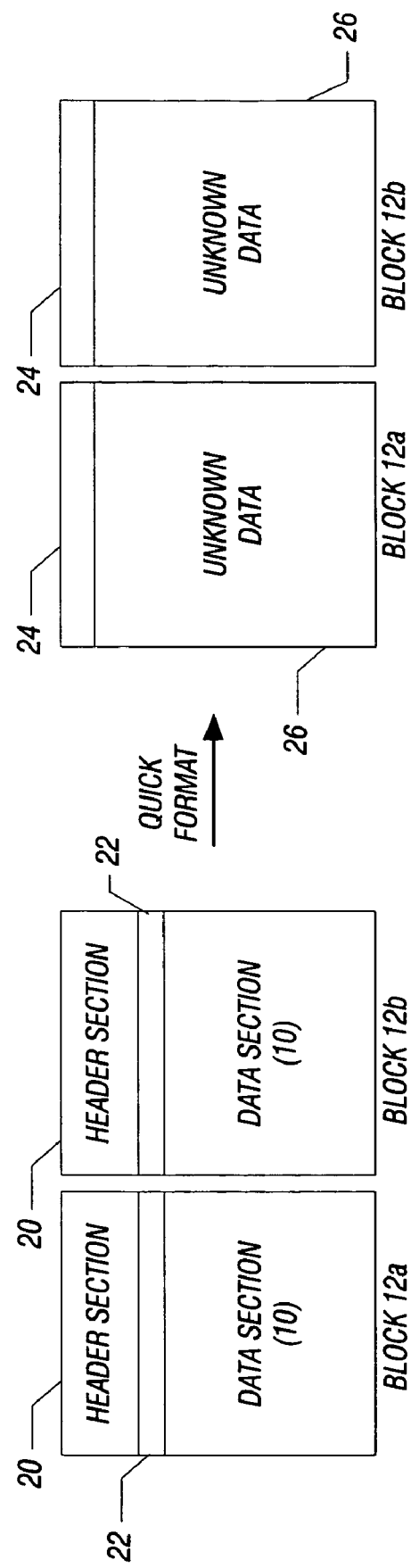
FIG. 1 is a schematic depiction of the conversion of a file format system in accordance with one embodiment.

Referring to FIG. 1, in accordance with one embodiment, a bit alterable memory may be formatted more quickly. "Formatting" refers to the process of putting the cells of a block in a known initial state.

Instead of simply erasing the blocks of the memory, a header for each block can be simply erased and written with a code which indicates that the entire block is now empty. Then when that block is rewritten, there is no need to go through the time consuming process of erasing each cell in the entire block.

Of course, while the discussion herein refers to blocks, a typical granularity of a non-volatile memory, other granularities, or memory portion sizes, may also be used and, thus, the present invention is not limited to the use of blocks.

As shown in FIG. 1, a data section 10 of a different block, such as blocks 12a and 12b, may be associated with a header section 20. Again, the header section 20 indicates system information for the corresponding file fragments in the data section 10. Thus, each block 12 includes a data section 10 and a header section 20. An empty header 22 may be located physically or logically at the end of each header section. The empty header 22 may act as a section boundary.

In order to quickly format the memory, a file system can simply write to the first header 24 in every block while leaving the other contents unchanged. This may be done, in one embodiment, by simply resetting the first header by programming 0xFF, for example. Since the first header 24 is then considered to be empty, the file system automatically treats the entire block as empty.

During the write operations at run time, the file system guarantees the existence of an empty header as a section boundary whenever allocating any headers. Particularly with ovonic memories, the impact is trivial due to the streaming programming feature used in these memories.

In some cases, the same mechanism can be applied to the reclaim operation of a single block at runtime, as necessary.

With respect to wear-leveling, some special system data, stored at specific locations can be utilized. That data indicates which header will be the first header in the header section so that over-frequent reset of the same header can be avoided and wear-leveling can be achieved.

Figure 2:
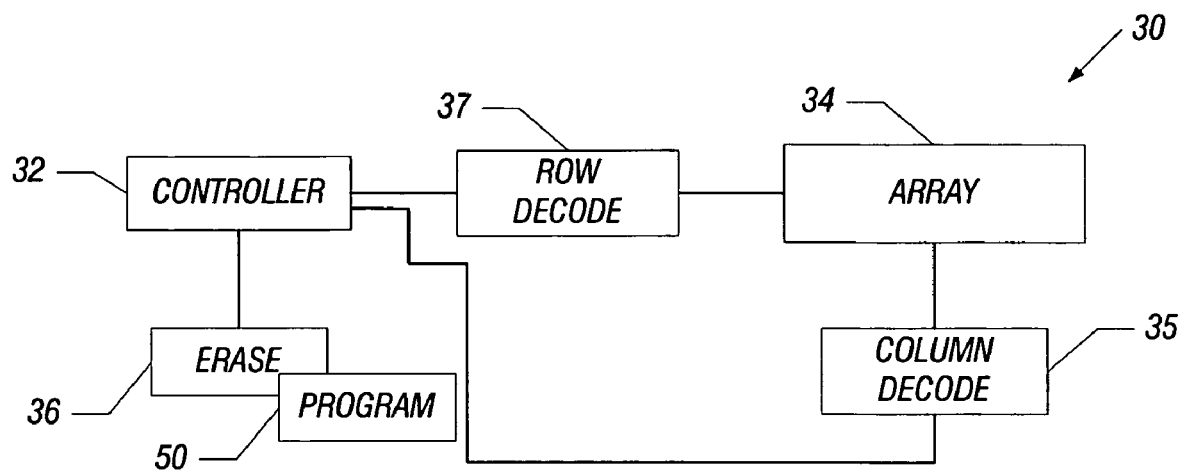
FIG. 2 is a depiction of a bit alterable memory in accordance with one embodiment.

Referring to FIG. 2, the memory 30 may include an array of memory cells 34. Each of the cells may be addressed by a row decode 37 and a column decode 35. The row decode 37 and column decode 35 are controlled by a controller 32. The controller 32 may operate an erase sequence 36 and a program sequence 50.

Figure 3:
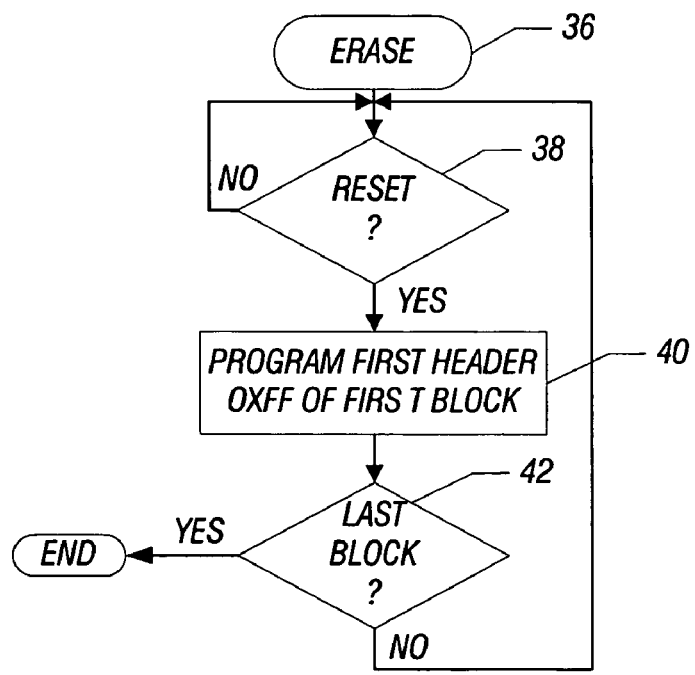
FIG. 3 is a flow chart for an erase sequence in accordance with one embodiment.

Referring to FIG. 3, the erase sequence 36 may be software, in accordance with one embodiment of the present invention, stored in a storage associated with the controller. However, the erase sequence 36 may be implemented in hardware, software, or firmware. It may be stored separately from the controller 32 or as part of the controller 32.

The erase sequence 36 begins by checking at 38 whether a reset has occurred. If so, it would normally be necessary to reformat the entire block of data. Instead, if a reset occurs, the first header of the first block can simply be programmed to a known state, such as 0xFF for example, as indicated in block 40. Then, the file system recognizes the entire block as being empty without the need to erase all the bits in the block.

A check at diamond 42 determines whether the last block has been reset. If not, the sequence continues, proceeding from block to block in the same fashion. If the last block has now been reset, the flow may end.

Figure 4:
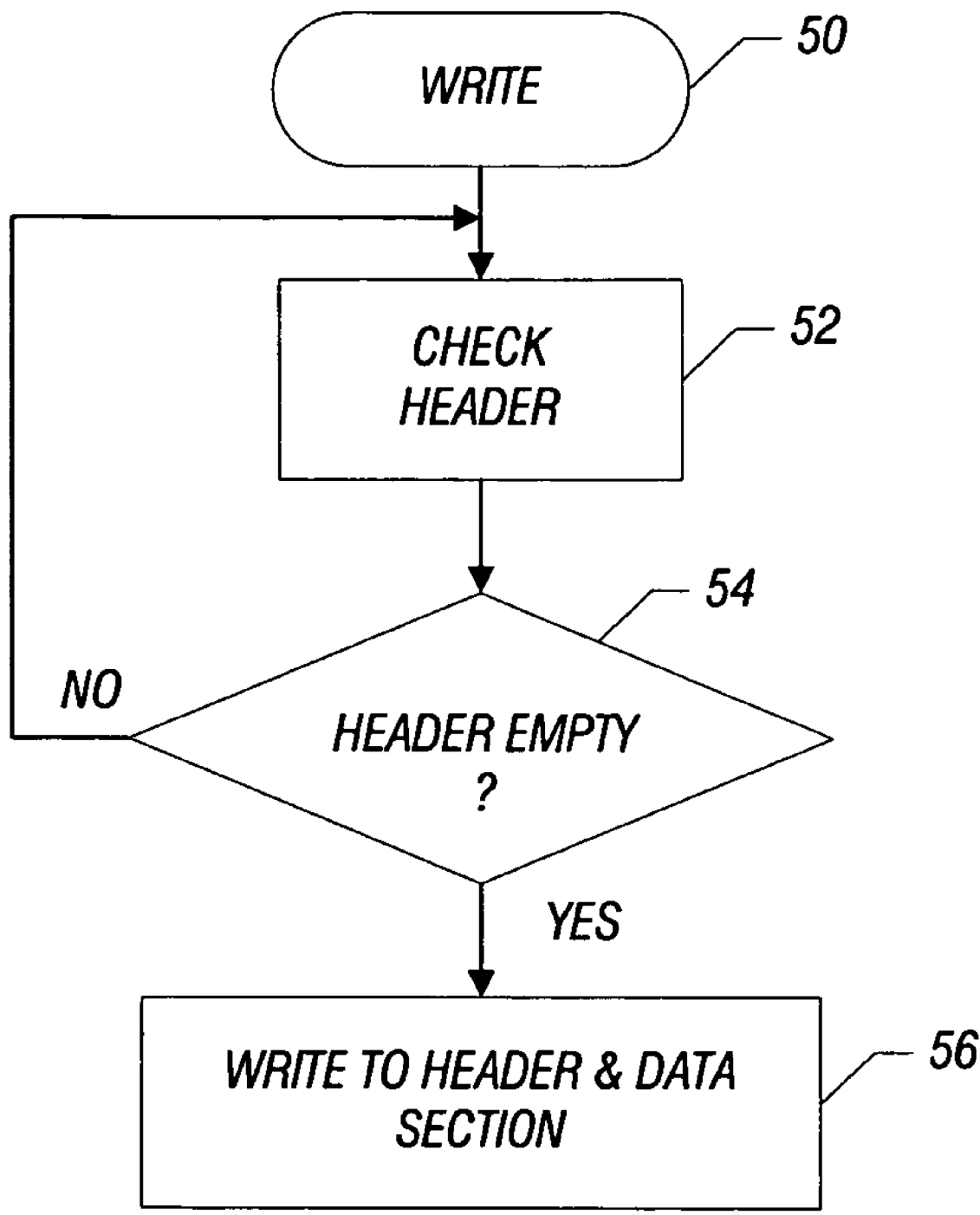
FIG. 4 is a flow chart for a write sequence in accordance with one embodiment.

Referring to FIG. 4, the write or program sequence 50 may also be implemented in software, hardware, or firmware on board the controller 32 or in a separate storage associated therewith. Initially, the header of a block to be written is checked, as indicated in block 52. If the header is empty, as determined by reading the first header of the first block and finding the code 0xFF (or some other predetermined code), as determined in diamond 54, the block is deemed an empty block available to be programmed or written to. Then, as indicated in block 56, the header and data section may be written to that block. Otherwise, the next header is checked in order to find an empty block.

A block of memory may be of any size. Generally, it includes one or more cells arranged in a conveniently sized group of cells to facilitate programming. For example, a block may be a given number of bytes in any given memory. Thus, from memory to memory, the capacity of a block may be different.

Figure 5:
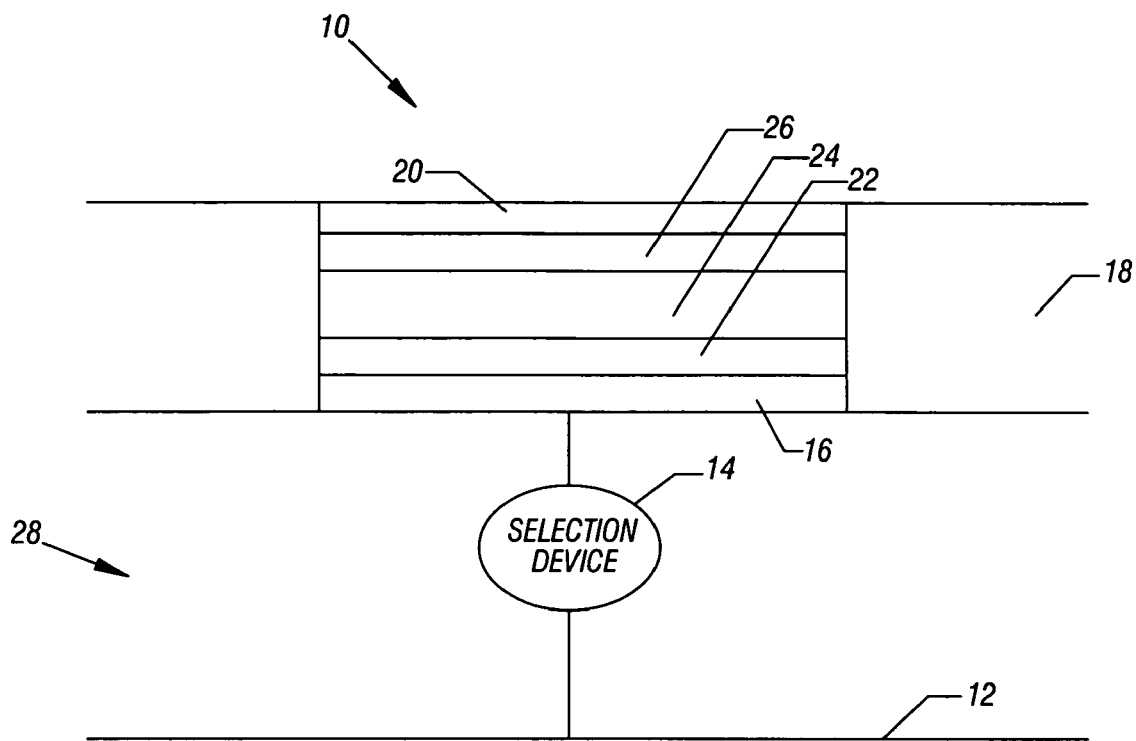
FIG. 5 is a schematic, enlarged cross-sectional view of a memory cell in accordance with one embodiment.

Referring to FIG. 5, a phase change memory may include an array 34 (shown in FIG. 2) with a cell 10 in one embodiment. While an example of an ovonic or phase change memory is provided, the present invention is not limited to one particular type of bit alterable memory. The cell 10 may be accessed by a pair of conductive lines including the line 12, which is coupled selectively to the cell 10 by a selection device 14. The selection device 14 may also be called an access device or an isolation device. The selection device 14, in one embodiment, may be formed in a semiconductor substrate 28. As examples, the selection device 14 may be a transistor or a diode. The lines 12 may be address lines that may be used to address one cell in an array of cells, addressable using said lines 12, for reading or programming.

A pore or opening may be defined in an insulating layer 18 formed over the substrate 28. The pore may include a lower electrode 16 coupled to the selection device 14 and upper electrode 20 coupled to another conductive line (not shown). In one embodiment, one conductive line 12 extends in a first direction and the other conductive line extends transversely thereto. The conductive lines may also be known as rows and columns.

Between the upper electrode 20 and the lower electrode 16 is an active phase change memory layer 24 which acts as the memory medium for the cell 10. Above the layer 24 is a chalcogenide or ovonic layer 26. A chalcogenide or ovonic layer 22 is positioned below the layer 24.

The layers 22 and 26 may be crystalline chalcogenide alloys designed to resist transformation into the glassy structural state in one embodiment. Thus, the layers 22 and 26 may be termed non-switching layers because in operation they do not change resistance due to change of phase or high field switching. Thus, the non-switching layers 22 and 26 may be called a stable structural phase. Alloys of permanently lower resistivity chalcogenide material may be used as the layers 22, 26. The layers 22, 26 may interface directly to the active phase change memory layer 24, providing resistive heating, as well as high thermal isolation of the active programmable volume within the layer 24. In one embodiment, the layers 22 and 26 may have a resistivity in the range of 10 to 100 Mohm centimeter.

Because of the resistivity supplied by the layers 22 and 26, more uniform current and better thermal isolation may be delivered to the sandwiched active phase change material layer 24 in one embodiment. This may reduce micro filamentation during programming of the phase change memory cell 10.

The active phase change layer 24 may be sandwiched between symmetrical top and bottom electrode systems, each including a non-switching layer 22 or 26 and an electrode 16 or 20. Heat loss prevention during phase change may be enhanced by the high thermal insulating properties of the layers 22 and 26 in some embodiments. The chemical similarity of the layers 22 and 26 to layer 24 provides for strong adhesion, integrity, and encapsulation in some embodiments. In situ deposition of all three layers 22, 24, and 26 may further improve the interfaces of electrode to phase change elements in some embodiments.

A crystalline chalcogenide alloy designed to resist phase transformation may be used for the layers 22 and 26 and to provide electrical contacts to the active phase change material layer 24. Examples of materials that may be utilized for the layer 22 and 26 include materials of the form $As_XSe_Y$ where X is 2 or 9 and Y is 3.

In one embodiment, the phase change material for the layer 24 may be a non-volatile, phase change material. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information. Ovonic or chalcogenide materials may be used to form the layers 22 and 26.

In one embodiment, the memory material for the layer 24 may be chalcogenide element composition from the class of tellurium-germanium-antimony ($Te_xGe_ySb_z$) material or a GeSbTe alloy, although the scope of the present invention is not limited to just these materials.

In one embodiment, if the memory material for the layer 24 is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to one of at least two resistance values within a range of resistance values to provide single bit or multi-bit storage of information.

Programming of the memory material in the layer 24 to alter the state or phase of the material may be accomplished by applying voltage potentials to the line 12 and electrode 20, thereby generating a voltage potential across the memory material layer 24. An electrical current may flow through a portion of the memory material layer 24 in response to the applied voltage potentials, and may result in heating of the memory material layer 24.

This heating and subsequent cooling may alter the memory state or phase of the memory material layer 24. Altering the phase or state of the memory material layer 24 may alter an electrical characteristic of the memory material layer 24. For example, resistance of the material layer 24 may be altered by altering the phase of the memory material layer 24. The memory material may also be referred to as a programmable resistive material or simply a programmable material.

In one embodiment, a voltage potential difference of about 3 volts may be applied across a portion of the memory material by applying about 3 volts to a lower line 12 and about zero volts to an upper electrode 20. A current flowing through the memory material layer 24 in response to the applied voltage potentials may result in heating of the memory material. This heating and subsequent cooling may alter the memory state or phase of the material.

In a "reset" state, the memory material in the layer 24 may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material in the layer 24 may be heated to a relatively higher temperature to amorphisize memory material and "reset" memory material (e.g., program memory material to a logic "0" value). Heating the volume or memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

The information stored in memory material layer 24 may be read by measuring the resistance of the memory material. As an example, a read current may be provided to the memory material using opposed line 12 and electrode 20 and a resulting read voltage across the memory material may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

Figure 6:
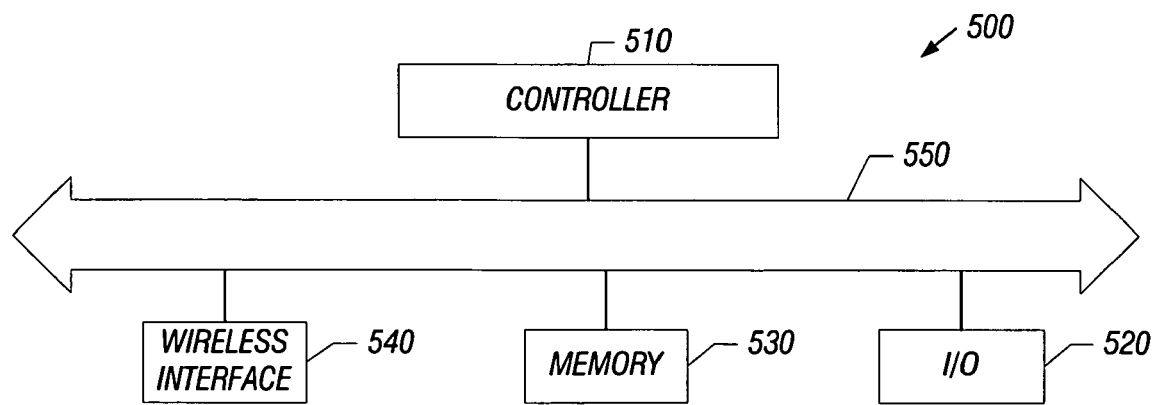
FIG. 6 is a system depiction of one embodiment.

Turning to FIG. 6, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of bit alterable memories including phase change memory that includes a cell such as, for example, the cell 10 illustrated in FIG. 5.

The I/O device 520 may be used to generate a message. The system 500 may use the wireless interface 540 to transmit and receive messages to and from a wireless communication network with a radio frequency (RF) signal. Examples of the wireless interface 540 may include a wireless transceiver or an antenna, such as a dipole antenna, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   resetting a bit alterable memory by programming a header of a block of said memory to indicate that the entire block is to be treated as an empty memory block despite the fact that the block has not been erased, wherein the bit alterable memory is a phase change memory.

2. The method of claim 1 including programming a predetermined code in said block to indicate that the block is to be treated as an empty block.

3. The method of claim 1 including reprogramming the first header of the block to indicate that the block is to be treated as empty.

4. The method of claim 3 including reprogramming the first header to determine whether or not the block is to be treated as empty.

5. A semiconductor memory comprising:
   a memory array, including a plurality of bit alterable cells; and
   a controller to reset a block of said array including a header associated with the block, by programming the header to indicate that the block is to may be treated as empty the fact that the block has not been erased, wherein said array includes chalcogenide memory cells.

6. The memory of claim 5 wherein said controller to reset a bit alterable memory by programming a header of the block to indicate that the entire block is to be treated as an empty block.

7. The memory of claim 6, said controller to program a predetermined code in said header to indicate that the block is to be treated as an empty block.

8. The memory of claim 6, said controller to program the first header of a block to indicate that the entire block is to be treated as empty.

9. The memory of claim 8, said controller to program the first header of a block with a code to indicate that the block is to be treated as empty.

10. The memory of claim 5 wherein said controller checks to determine whether a code has been written into the first header to determine whether the block is empty.

11. A system comprising:
    a processor;
    a wireless interface coupled to said processor; and a bit alterable memory, coupled to said processor, including an array and a controller to program a header of a block of the array to indicate that the block is to may be treated as empty despite the fact that the block has not been erased, wherein said array includes chalcogenide memory cells.

12. The system of claim 11 wherein said controller to reset the bit alterable memory by programming a header of the block to indicate that the entire block is to be treated as an empty block.

13. The system of claim 12, said controller to program a predetermined code in said header to indicate that the block is to be treated as an empty block.

14. The system of claim 12, said controller to program the first header of a block to indicate that the entire block is to be treated as empty.

15. The system of claim 14, said controller to program the first header of a block with a code to include that the block is to be treated as empty.

16. The system of claim 11 wherein said controller checks to determine whether a code has been written into the first header to determine whether the block is empty.

* * * * *

UNITED STATES PATENT AND TRADEMARK OFFICE
CERTIFICATE OF CORRECTION

| | | |
|---|---|---|
| PATENT NO. | : 7,831,762 B2 | Page 1 of 1 |
| APPLICATION NO. | : 11/605572 | |
| DATED | : November 9, 2010 | |
| INVENTOR(S) | : Cheng Zheng | |

It is certified that error appears in the above-identified patent and that said Letters Patent is hereby corrected as shown below:

Column 6:
Line 22, "is to may be treated" should be --is to be treated--;
Line 22, after "empty" insert --despite--;
Line 46, "is to may be treated" should be --is to be treated--.

Signed and Sealed this
Nineteenth Day of April, 2011

David J. Kappos
*Director of the United States Patent and Trademark Office*